United States Patent
Stenson et al.

(10) Patent No.: US 10,283,582 B2
(45) Date of Patent: May 7, 2019

(54) MICROELECTRONIC CIRCUITS AND INTEGRATED CIRCUITS INCLUDING A NON-SILICON SUBSTRATE

(71) Applicant: ANALOG DEVICES GLOBAL, Hamilton (BM)

(72) Inventors: Bernard P. Stenson, County Limerick (IE); Michael Morrissey, County Limerick (IE); Seamus A. Lynch, Murroe (IE)

(73) Assignee: Analog Devices Global, Hamilton (BM)

( * ) Notice: Subject to any disclaimer, the term of this patent is extended or adjusted under 35 U.S.C. 154(b) by 550 days.

(21) Appl. No.: 13/776,545

(22) Filed: Feb. 25, 2013

(65) Prior Publication Data

US 2014/0240944 A1    Aug. 28, 2014

(51) Int. Cl.
  *B81B 7/00* (2006.01)
  *H01L 49/02* (2006.01)
  *H01L 27/01* (2006.01)

(52) U.S. Cl.
  CPC ............ *H01L 28/00* (2013.01); *H01L 27/016* (2013.01); *H01L 28/10* (2013.01); *H01L 28/20* (2013.01); *H01L 28/60* (2013.01)

(58) Field of Classification Search
  CPC .............. B81C 1/0023; B81C 1/00793; H01L 23/3117; G01P 5/0802; B81B 7/00; B81B 7/02
  USPC .......... 361/760, 766, 792–795; 174/258–262
  See application file for complete search history.

(56) References Cited

U.S. PATENT DOCUMENTS

| | | | | |
|---|---|---|---|---|
| 5,081,563 A | * | 1/1992 | Feng et al. | 361/795 |
| 5,280,192 A | * | 1/1994 | Kryzaniwsky | 257/723 |
| 5,872,496 A | * | 2/1999 | Asada | H01H 50/005 257/415 |
| 7,104,129 B2 | * | 9/2006 | Nasiri | B81C 1/0023 73/504.04 |
| 7,897,877 B2 | * | 3/2011 | Das et al. | 174/260 |
| 7,902,661 B2 | | 3/2011 | Smeys et al. | |
| 2002/0153236 A1 | | 10/2002 | Song et al. | |
| 2004/0070959 A1 | * | 4/2004 | Sakai | H05K 1/189 361/792 |
| 2004/0077121 A1 | * | 4/2004 | Maeda | H01L 27/14618 438/75 |
| 2004/0087043 A1 | * | 5/2004 | Lee | B81C 1/00269 438/6 |

(Continued)

OTHER PUBLICATIONS

Goggin, et al., "Fully integrated, high yielding, high reliability DC contact MEMS switch technology & control IC in standard plastic packages," IEEE Sensors, pp. 958-961, 2011.

(Continued)

*Primary Examiner* — Tuan T Dinh
(74) *Attorney, Agent, or Firm* — Knobbe, Martens, Olson & Bear, LLP

(57) ABSTRACT

A microelectronic circuit having at least one component adjacent a carrier that is not a semiconductor or sapphire. The circuit includes a component bearing stack of one or more layers having one or more passive components, which are adjacent or bonded to the carrier. In certain embodiments, the circuit also includes an etch stop layer of a material having a slower etch rate than silicon and a bond layer bonding the carrier and the component bearing one or more layers.

26 Claims, 19 Drawing Sheets

(56) References Cited

U.S. PATENT DOCUMENTS

| | | | | |
|---|---|---|---|---|
| 2007/0134849 | A1* | 6/2007 | Vanfleteren et al. | 438/123 |
| 2008/0073110 | A1* | 3/2008 | Shioga | H05K 1/162 174/258 |
| 2008/0277778 | A1* | 11/2008 | Furman | H01L 21/2007 257/713 |
| 2010/0101253 | A1* | 4/2010 | Searle | A41D 13/0025 62/259.3 |
| 2012/0001276 | A1* | 1/2012 | Huang | B81B 7/0064 257/416 |
| 2012/0080832 | A1 | 4/2012 | Woodard et al. | |
| 2012/0228755 | A1* | 9/2012 | Nagano et al. | 257/698 |
| 2013/0140155 | A1 | 6/2013 | Urvas et al. | |
| 2013/0168740 | A1* | 7/2013 | Chen | B81C 1/00238 257/254 |
| 2014/0151820 | A1* | 6/2014 | Howe | H01L 23/3171 257/415 |
| 2014/0239423 | A1* | 8/2014 | Liu | B81C 1/00793 257/417 |
| 2015/0128703 | A1* | 5/2015 | Kaelberer | G01P 15/0802 73/514.01 |

OTHER PUBLICATIONS

Li, et al., "Electro-thermally Actuated RF MEMS Switch for Wireless Communication." NANO/MICRO Engineered and Molecular Systems (NEMS), 2010 5th IEEE International Conference on, IEEE, Piscataway, NJ, USA, Jan. 20, 2010, pp. 497-500.

Sterner, et al., "Static Zero-Power-Consumption Coplanar Waveguide Embedded DC-to-RF Metal-Contact MEMS Switches in Two-Port and Three-Port Configuration." IEEE Transactions on Electron Devices, IEEE Service Center, Piscataway, NJ, US, vol. 57, No. 7, Jul. 1, 2010, pp. 1659-1669.

\* cited by examiner

MICROELECTRONIC CIRCUITS AND INTEGRATED CIRCUITS INCLUDING A NON-SILICON SUBSTRATE

FIELD

The present invention relates to the provision and manufacture of microelectronic circuits on a substrate, such as a handle wafer.

BACKGROUND

It is often necessary or desirable for electronic circuits to work at high frequencies. In this context "high" may mean hundreds or thousands of MHz. Circuits may require the inclusion of non-transistor components. Such components may also be referred to as passive components, in that the components do not have current flow across PN junctions or other transistor-like properties as part of their fundamental operation.

Such passive components typically include resistors, capacitors, inductors and transformers. These components may be formed into filter or other circuit configurations where it is desirable that the substrate upon which they are formed exhibits low loss even at very high frequencies.

SUMMARY

According to a first aspect of the present invention there is provided a microelectronic circuit having at least one component adjacent a carrier structure substrate that is not a semiconductor or sapphire.

Microelectronic as used herein relates to components and circuits formed at sizes and scales applicable to wafer level processing typically associated with VLSI circuits.

Silicon is a semiconductor, and hence supports parasitic current flows between components, and between ends or terminals of a component. It is known that alternative fabrication technologies, such as silicon on sapphire, can be employed to reduce losses in the handling substrate, but such techniques increase wafer costs by over 25 times. This makes such techniques prohibitively expensive in a price competitive industry.

The present disclosure according to one aspect provides circuits, which may be comprised of passive components, MEMS components (such as switches and sensors), and electronically controllable passive components such as switchable capacitor arrays and varactors over an insulating carrier. Furthermore regions of semiconductor may be provided on the carrier (which may also be regarded as a substrate) such that active components, such as transistors and diodes may be provided.

Advantageously the carrier or substrate is highly insulating. In an embodiment the substrate is glass or quartz. Usually glass contains a high proportion of silicon dioxide.

However other insulating and glass-like materials may also be used. For example glass containing germanium dioxide can be transparent to infra-red radiation. Mixed silicon-germanium glasses also exist. All of these may be suitable carriers and fall within the term "glass" as used herein.

Other semiconductor oxides may exhibit suitably high resistivity and compatibility with semiconductor fabrication processes.

The non-silicon and non-sapphire support may be provided as a layer bonded to one or more component bearing layers. The bonding may be provided by a bond layer. The bond layer may be a glass layer. The bond layer may be glass frit. Glass frit is also known as glass solder.

Glass frit bonding utilizes a low melting point glass. It is also compatible with many materials used in fabrication of integrated circuits and can bond to silicon, silicon dioxide, silicon nitride, aluminum, titanium and glass, as a non-limiting list of examples.

Other bonding technologies may also be used, such as anodic bonding and metal-metal bonding.

In an embodiment there is provided an integrated or microelectronic circuit comprising a glass substrate, a bond layer attached at a first side to the substrate and a first layer attached to a second side of the bond layer, wherein the first layer has at least one passive component formed therein or thereon, or carries further layers having at least one passive component formed therein or thereon. Where a plurality of insulating layers are provided, they form a stack of layers. The stack of layers is bonded to the glass carrier by a bond layer.

The at least one passive component is formed using integrated circuit fabrication techniques. Thus the components are formed on a scale suitable for inclusion within an integrated circuit package.

According to a second aspect, there is provided a method of forming a circuit comprising:
  forming a circuit using suitable semiconductor fabrication techniques above a first surface of a semiconductor substrate;
  attaching the circuit and semiconductor substrate to a further substrate such that the circuit is positioned between the semiconductor substrate and the further substrate; and
  removing, in part or wholly, the semiconductor substrate.

It is thus possible to "transfer" a circuit from the semiconductor substrate to further substrate, whose electrical properties can be chosen for other parameters, such as for low loss. The further substrate may be $SiO_2$, glass, sapphire, or a bonded semiconductor wafer.

An embodiment of the method comprises:
  (a) forming an etch stop layer over a region of a first side of a semiconductor wafer;
  (b) forming at least one further layer over the etch stop layer, where the further layer or further layers have circuit components formed therein or thereon;
  (c) bonding a further, for example non silicon, substrate to an exposed surface of the at least one further layer; and
  (d) etching the region of the semiconductor wafer away to thin or remove the wafer in the region.

According to a further aspect of the present invention there is provided a die formed in accordance with the second aspect for use within an integrated circuit package.

BRIEF DESCRIPTION OF THE DRAWINGS

The present invention will now be described, by way of non-limiting example, with reference to the accompanying drawings, in which.

DETAILED DESCRIPTION OF THE PREFERRED EMBODIMENT

Figure 1:
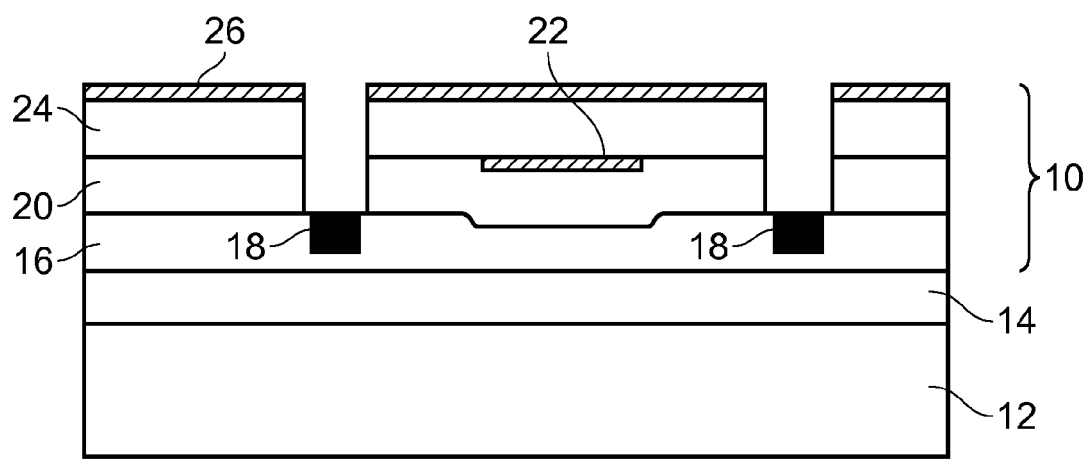
FIG. 1 shows an example of part of an integrated circuit constituting an embodiment.

In the following description, terms such as "above", "below", and so on refer to components or processes shown in the orientation of the associated drawing, and are not to be construed as limiting the configuration of elements within a completed device.

It is known that components such as resistors, capacitors, inductors, transformers and contacting switches (as opposed to operating a transistor as a switch) often take up a disproportionate amount of space within an electronic product, as compared to transistors and transistor circuits implemented as integrated circuits. Designers may chose to implement some of these components within an integrated circuit. Such implementation typically involves trying to form the capacitors, inductors, transformers and contacting switches on the same die (substrate) that carries the transistors of the integrated circuit.

This approach can work satisfactorily over a relative wide range of frequencies, but the performance tends to degrade as the frequency increases, for example into the 100s of MHz and into the GHz frequency ranges. However, with circuit designers wishing to provide circuits with performance up to 40 GHz and beyond this degradation is undesirable.

The degradation can occur because the die, being semiconducting, provides the opportunity for parasitic, and possibly out of phase, current flows between components. This gives rise to unexpected or unwanted frequency responses in the circuit formed by the integrated resistive R, inductive L, and capacitive C components and other passive components.

This problem is known, and can be overcome by use of technologies such as silicon on sapphire device fabrication where the "handle" wafer over which the components and integrated circuits are built is sapphire as opposed to silicon—whether CZ (Czochralski) silicon or "float zone" (FZ) silicon. Float zone silicon can be made consistently less conductive and experiences less loss than CZ silicon, but it is much more expensive and is fragile. Sapphire, unlike glass, can provide crystal templates for heteroepitaxy of single-crystal semiconductor materials.

However, the problem with sapphire is its prohibitive cost. To put this in perspective, an 8 inch diameter wafer of CZ silicon (as is commonly used in the semiconductor industry) cost around US$80 as of 2012. A similarly sized sapphire wafer cost around US$1,800. This is a prohibitive price difference, and precludes the economic use of sapphire from most commercial circuits due to price.

Furthermore, whilst sapphire is physically robust, it is not compatible with standard manufacturing processes as used for silicon circuit fabrication. Nor has a "through substrate via" (TSV) technology become available for sapphire substrates.

Not surprisingly, use of CZ and FZ silicon is supported in integrated circuit fabrication facilities.

The inventors realized that fabrication methods using steps outside the normal offering of a semiconductor fabrication facility would incur great cost, and would be unlikely to be adopted if re-tooling was entailed. However, it would also be desirable to have certain parts of a circuit provided in the finished product, on an insulating substrate. Thus a process that could use conventional silicon-based processing steps to form an integrated circuit die, and where the circuit or at least part of the circuit would be formed over an insulator, would have some benefit. Significant utility would be found if inexpensive substrates, such as glass or other suitable insulators could be used.

FIG. 1 illustrates a cross section through a portion of an integrated circuit constituting an embodiment of the present invention. The integrated circuit comprises a component bearing portion, generally indicated 10, provided over a non-semiconductor substrate 12. The non-semiconductor substrate is preferably a silicon dioxide based glass. Such a glass is highly insulating, mechanically robust and inexpensive. The glass may be doped with lead and/or phosphates, i.e. common glass.

The glass substrate 12 may be substituted for other substrates having appropriate properties, such as mineral insulators like quartz, or other insulating oxides. However for the purposes of discussion, the substrate 12 will be referred to as a glass substrate.

The component bearing portion 10 is attached to the glass substrate 12 by a suitable bond, which may be provided by a bond layer 14. The bond layer may be a glass frit (also known as a glass solder) which is available as a screen printable paste, and which has a lower melting point than the glass substrate 12. However other materials and techniques may be used for securing the component bearing portion to the insulating substrate provided by glass substrate 12.

The component bearing portion 10 may, as shown here, comprise a plurality of layers. The plurality of layers can be regarded as forming a stack of layers over the glass substrate 12. Working upwardly from the bond layer 14, a (first) insulating layer 16 of the component bearing portion 10 is a silicon dioxide layer which has, in this example, a metal track formed therein which represents a simple inductive component, such as a single turn inductor. The sections 18 represent bond pads or terminations of the metal track which is formed into the inductive component above or below the plane of FIG. 1.

The metal track and/or other metal tracks may also be used to form a connector layer to other components.

The next (second) insulating layer 20 may also be a silicon oxide layer that cooperates with the layer 16 to insulate the metal layer (connectors and inductors) from other components formed vertically offset from the inductors or metal tracks. The layer 20 may, as shown in this example, have a resistor 22 formed at the boundary of the layer 20. The resistor may be formed as a thin film component using metal, metal oxide or other suitable and known materials.

A further (third) insulating layer 24, for example of silicon oxide, covers the layer 22 and the resistor. The layer 24 may be covered with final layer 26 which may be a slow etching material such as silicon dioxide or silicon nitride, or other suitable material, relative to adjacent materials removed during processing (see description below of FIGS. 7 and 8). As will be described later, layer 26 defines an etch stop layer, but where layer 24 is of a slow etching material then layer 24 may act as an etch stop layer and an explicit etch stop layer 26 can be omitted.

It can be observed that the materials forming this embodiment are the glass substrate, the glass bond layer, $SiO_2$ insulating layers (so very similar to glass), and the metal layer used to form the passive components. Each level containing a passive component can be embedded by underlying and overlying insulating layers. For example, if the first insulating layer 16 is considered the Nth insulating layer, metal components represented by 18 can be followed by deposition of the Nth+1 layer in the form of the second insulating layer 20, etc.

Thus we have microelectronic scale inductors, resistors and capacitors (which can be formed by metal pads spaced apart from one another by one of the insulating layers) formed primarily of metal. So at a simplistic level we have metal components supported by and embedded in glass or $SiO_2$.

Figure 2:
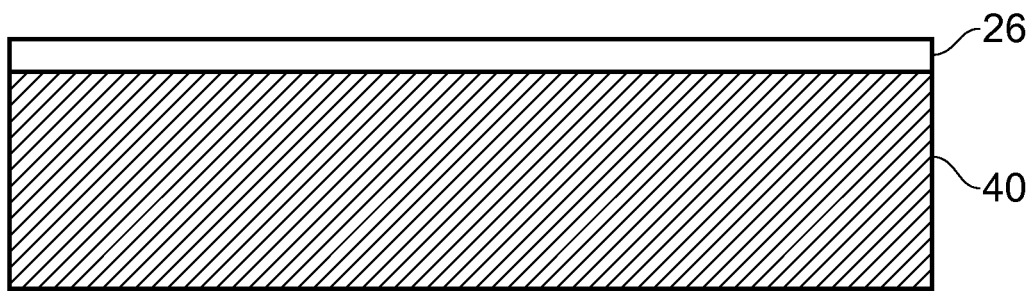
FIG. 2 schematically shows a silicon wafer after a first processing step to deposit an etch stop layer.

A process for forming the microelectronic circuit shown in FIG. 1, and similar circuits, will now be described. The process starts, as shown in FIG. 2, with, for example, a standard silicon handle wafer 40 as commonly used in the fabrication of integrated circuits. Next the etch stop layer 26 is formed over the silicon wafer 40. The etch stop layer may be formed of thermal oxide, silicon dioxide or silicon nitride, or other slow etching material relative to the silicon handle wafer 40. In the presence of an etchant, such as 40 per cent potassium hydroxide (although it should be noted that other concentrations and other etchants can be used), silicon etches at a rate of around 4-8 microns per hour. Silicon dioxide etches at around 10 nanometers per hour and silicon nitride etches at less than 1 nanometer per hour, at 40° C. (data obtained from http://www.cleanroom.beyu.edu/koh.phtml which referred to data published at J. Electrochem. Soc. Vol 137, 11, 3612-3632). Thus, the layer 26 may be fabricated with a sufficient thickness to ensure that the etchant, such as potassium hydroxide, will not penetrate through the layer for the etch time and prevailing conditions allocated to it.

Figure 3:
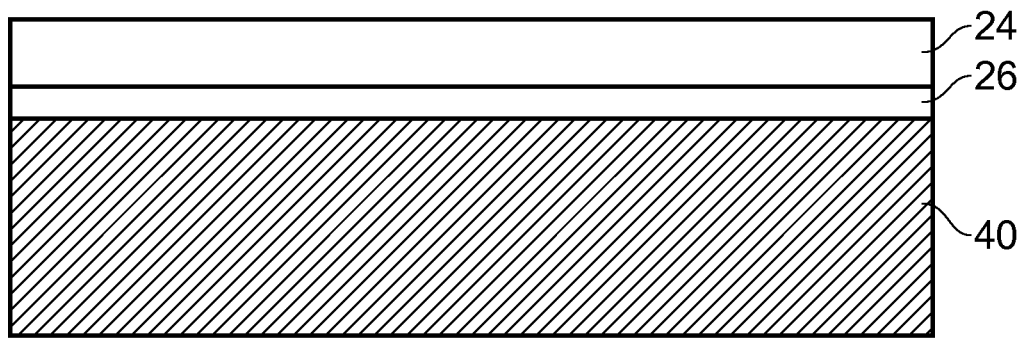
FIG. 3 shows the wafer of FIG. 2 after a first insulating layer has been formed thereon.

Next, as shown in FIG. 3, a layer of material 24 is deposited over the etch stop layer 26. The layer 24 may, for example, be formed of silicon oxide deposited as part of a chemical vapor deposition step. It also follows that, since the etch rate of silicon oxide, for example silicon dioxide, is so much slower than that of silicon, that the layers 24 and 26 might be combined as a single combined insulator and etch stop or etch retardation layer.

Figure 4:
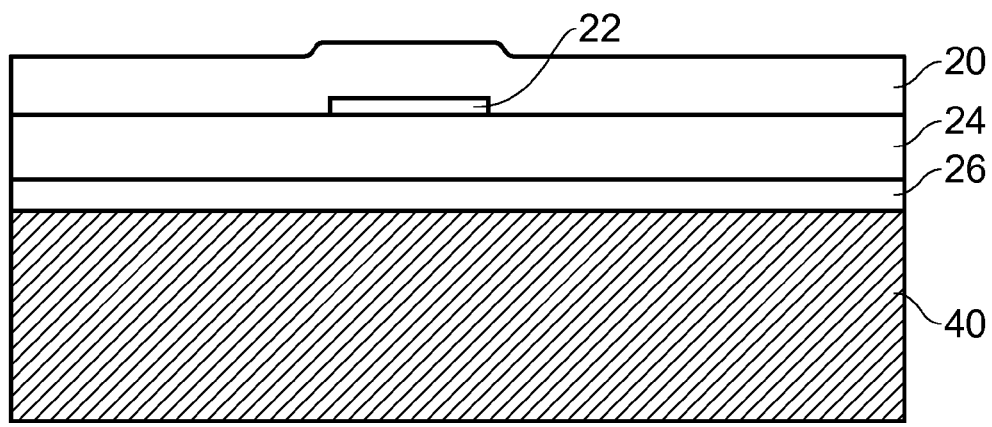
FIG. 4 shows the wafer of FIG. 3 after a passive component and a second insulating layer have been deposited thereon.

As shown in FIG. 4, one or more passive components may be formed over the oxide layer 24. In the example shown in FIG. 4 a single thin film resistor 22 is illustrated as being deposited over the layer 24. The thin film resistor can be deposited and patterned using any suitable technology known to the person skilled in the art. Similarly, conductive tracks to and from the thin film resistor 22 so as to form interconnections to other components can be deposited and patterned at this stage using techniques known to the person skilled in the art. If desired, damascene techniques can be used to embed the thin film resistor 22 and/or tracks within the upper portions of the layer 24. The conductive tracks to and from the resistor 22 have been omitted from FIG. 4 for diagrammatic clarity. Once one or more components have been formed on the surface of the oxide layer 24, they may then be embedded within a further insulating layer 20. The insulating layer 20 may also be silicon oxide deposited by chemical vapor phase deposition.

Figure 5:
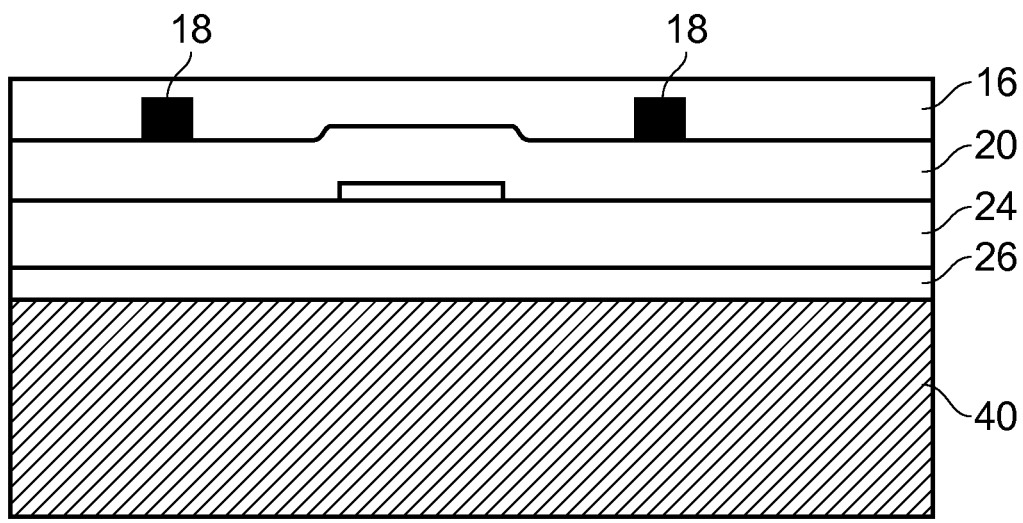
FIG. 5 shows the wafer of FIG. 4 after an inductive component and third insulating layer have been formed thereon.

Following formation of the oxide layer 20, further components may be formed over the layer 20, as shown in FIG. 5. Here metallic tracks which, when viewed from above, provide connections to and from part of a spiral inductor are formed over the layer 20. FIG. 5 shows terminations of the tracks in order that the process for making connections to the spiral inductor can be described in detail later on. However the tracks could also terminate in plate-like regions in order to form a capacitor or might connect to other thin film resistors. Following formation of the metallic tracks 18, they are embedded within a further insulating layer 16 which again may be formed of silicon oxide using a suitable process technique such as chemical vapor phase deposition. After forming the silicon oxide layer 16 the upper surface of the layer may be subjected to planarization, for example by chemical mechanical polishing.

Figure 6:
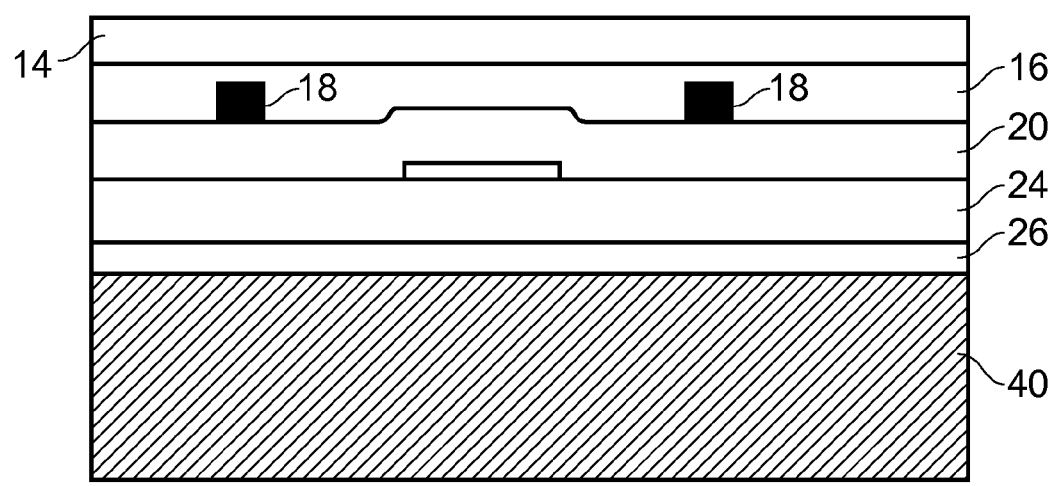
FIG. 6 shows the wafer of FIG. 5 with a bond layer formed thereon.

Next, and as shown in FIG. 6, the bond layer 14 is formed over the silicon oxide layer 16. The bond layer 14 may be provided as an anodic bond or may be a glass frit. Glass frits are well known to the person skilled in the art and can be applied by screen printing processes. Since the glass frit is applied as a paste, it may be applied over a non-planar surface and has the ability to fill in any voids within the surface.

Figure 7:
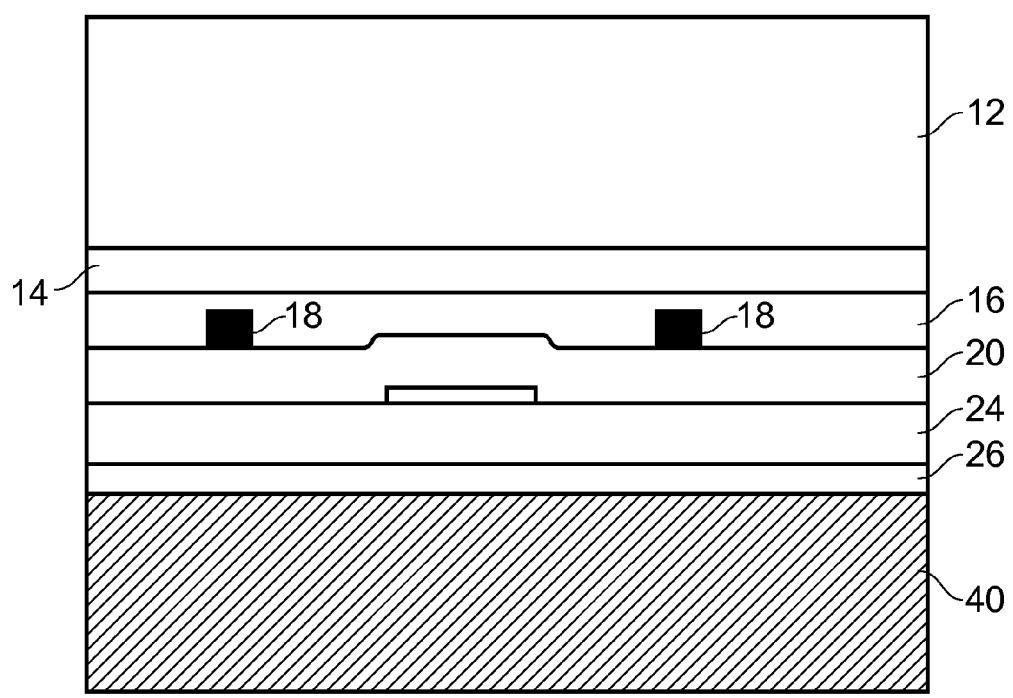
FIG. 7 shows the wafer of FIG. 6 with a glass substrate bonded thereto.

Then, and as shown in FIG. 7, the glass substrate 12 is brought into contact with the bond layer, e.g. the glass frit 14, and the wafer is heated to the frit bonding temperature and then cooled again such that the glass wafer 12 becomes adhered to the rest of the structure. Then the silicon handle wafer 40 may be removed either partially or wholly through a combination of mechanical processing, for example polishing, etching or chemical-mechanical polishing.

Following removal of the silicon wafer, the etch stop layer 26 becomes exposed. The etch stop layer 26 may then be masked and selectively etched with a suitable etchant to make contact to the metallic tracks 18. For example, the etch stop layer and underlying insulators can be etched by as hydrofluoric acid which etches silicon dioxide, but which does not etch silicon. Hydrofluoric acid is a very fast and aggressive etchant of silicon oxide, so it is normally used as a buffered solution with ammonium fluoride which allows the etching time to be reliably correlated to the etching depth. It should also be noted that the etch rate of silicon dioxide depends on the density of the oxide which, as an amorphous layer, can have a more compact structure if it is only grown in oxygen than if it is grown by chemical vapor deposition. The etching process may be used to form trenches through the silicon dioxide layers to, for example, expose selected portions of the metallic layer 18 such that contact can be made to it. This gives rise to the structure shown in FIG. 1.

Figure 8:
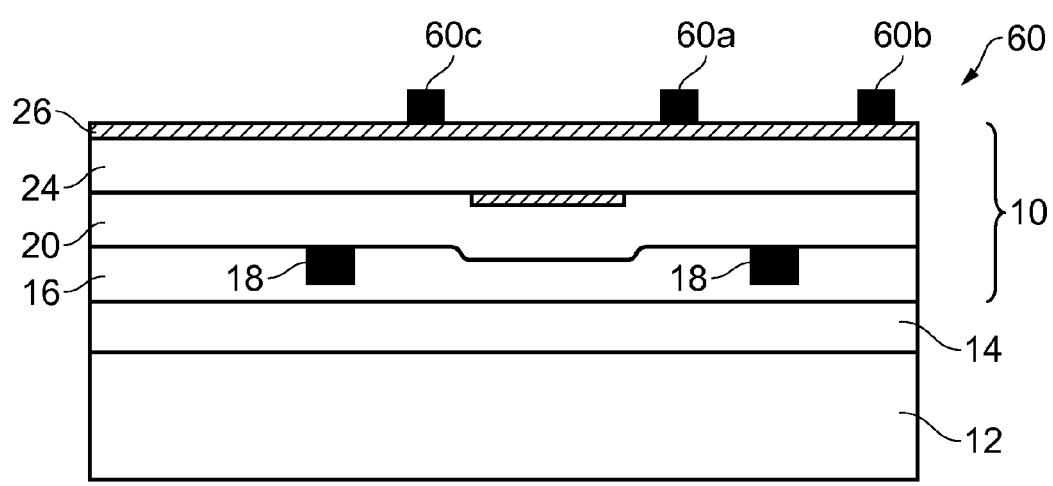
FIG. 8 shows the wafer of FIG. 7 after the silicon substrate has been removed and "back side" processing has been commenced to form a further inductive component on the etch stop layer.

Additionally or alternatively, as shown in FIG. 8, further structures may be formed over the insulating layer 24 and/or the etch stop layer 26. Thus as shown in FIG. 8 further passive components such as a further metallic spiral 60 is shown (this time having its diameter lying in the plane of FIG. 8 such that contact regions 60a and 60b at the ends of the spiral are illustrated, along with a mid point 60c of the metallic spiral). The metallic spiral 60 is illustrated as a single turn, although it will be appreciated that multi-turn structures may be formed. The metallic spiral may form an inductor, or if suitably positioned with respect to another coil, such as that formed by metal track 18, it may cooperate with the other coil to form a transformer.

Figure 9:
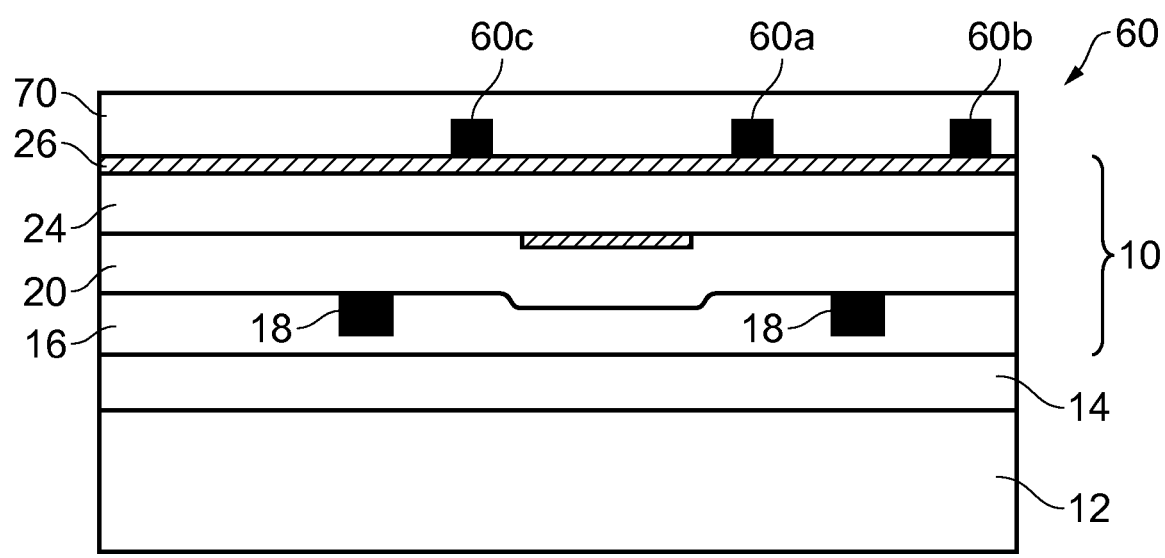
FIG. 9 shows the wafer of FIG. 8 after the further inductive component has been embedded within a fourth insulating layer.
Figure 10:
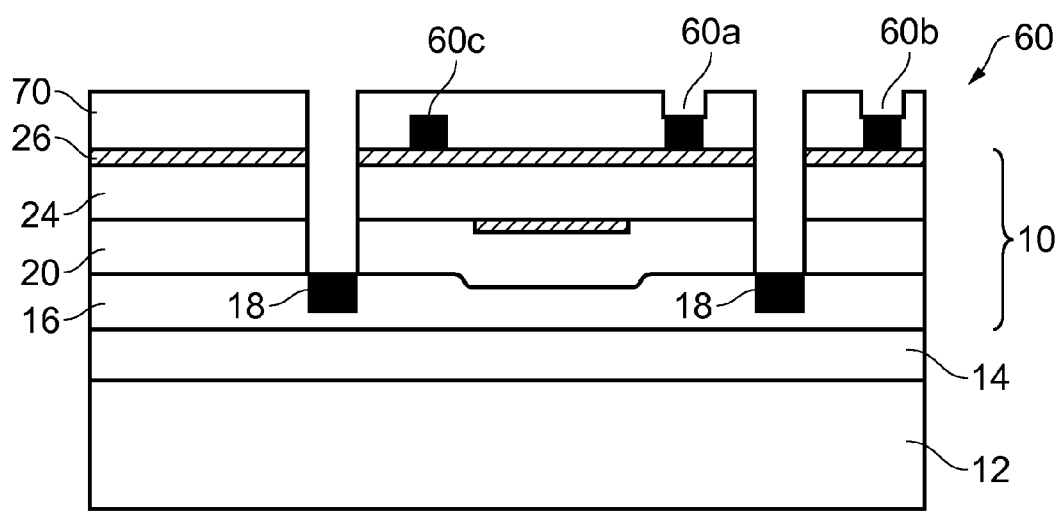
FIG. 10 shows the wafer of FIG. 9 after masking and etching to form trenches such that connections can be formed to selected buried contacts or buried structures.

Following deposition of one or more further components, such as coils (as shown), resistors, or plates of capacitors, those further components may then be encapsulated within a further layer of an insulator. Such a further layer may be a layer of silicon oxide 70 as shown in FIG. 9, which for example may be deposited by chemical vapor phase deposition. Other insulating materials may be deposited, such as polyimide or silicon nitride. Thus a further stack can be formed over the etch stop layer. The structure can then be masked and selectively etched to form openings in the various silicon oxide layers to reveal underlying contact regions, as shown in FIG. 10, where selective etching has been performed so as to reveal the contacts 18 formed within the layer 16, and the contacts 60a and 60b formed within the layer 70. These openings may then be filled with metal to form vias to a further metallic interconnect layer (if necessary) over the layer 70 which itself may then be encapsulated in yet a further layer of insulator. Alternatively the vias may be formed in the intermediate layers to connect to connecting tracks for connecting to components formed in the adjacent layer. Thus a via may be formed through layer 20 so as to connect the regions 18 to interconnecting tracks formed on the surface of the layer 20 and beneath (or partially within) layer 24. An opening would not need to be formed in the layer 24 at a position directly above the contacts 18.

Figure 11:
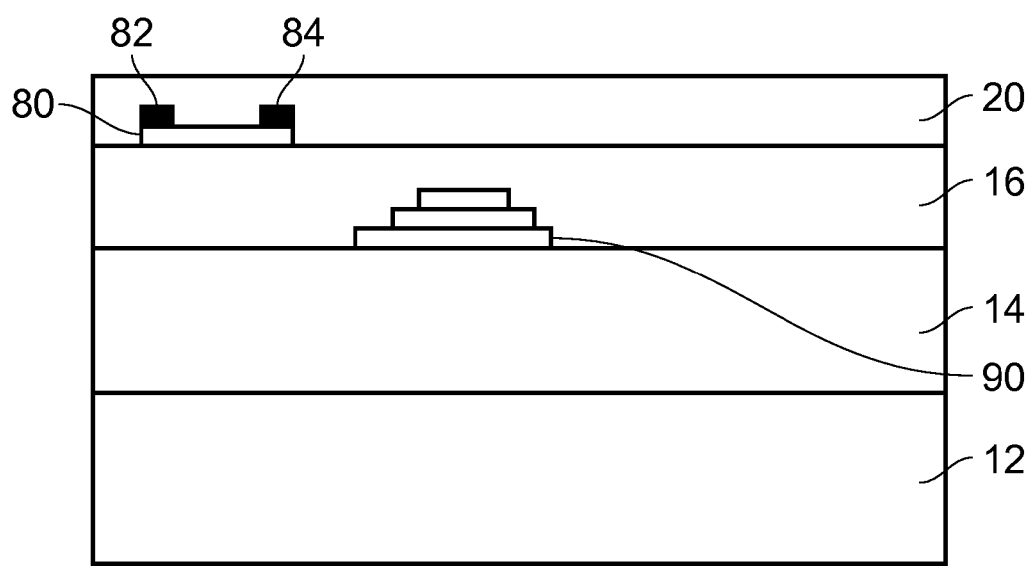
FIG. 11 shows a second wafer having been processed generally as described with respect to FIGS. 2 to 7 so as to form two passive components supported by a glass substrate and embedded within insulating layers.
Figure 12:
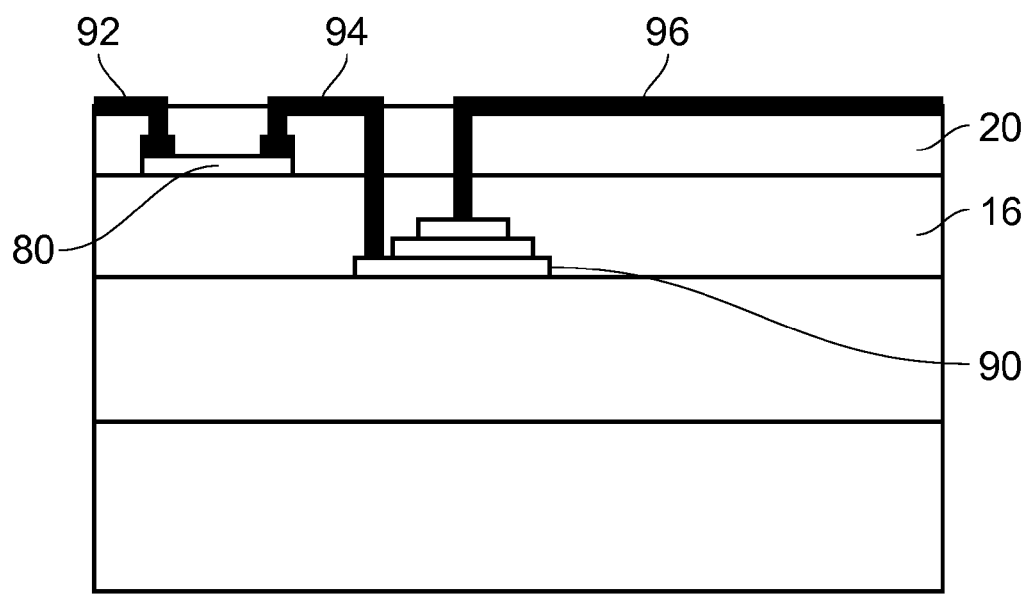
FIG. 12 shows the wafer of FIG. 11 after masking, etching and metallization steps have been performed so as to form vias and planar metallic tracks.

FIG. 11 is a schematic cross section through a further embodiment where the die has been processed to form a thin film resistor 80 with associated bond regions 82 and 84 in layer 20, and a varactor module 90 encapsulated within the layer of silicon oxide 16. The die is then selectively masked and etched to form apertures in the layers 20 and 16 such that a subsequent metallization step can be performed to deposit metal tracks 92, 94 and 96 that interconnect the thin film resistor 80 and the varactor 90, as shown in FIG. 12, and also allow the components to be connected to other components (not shown in FIG. 12) or to interconnection nodes or terminals (also not shown).

Figure 13:
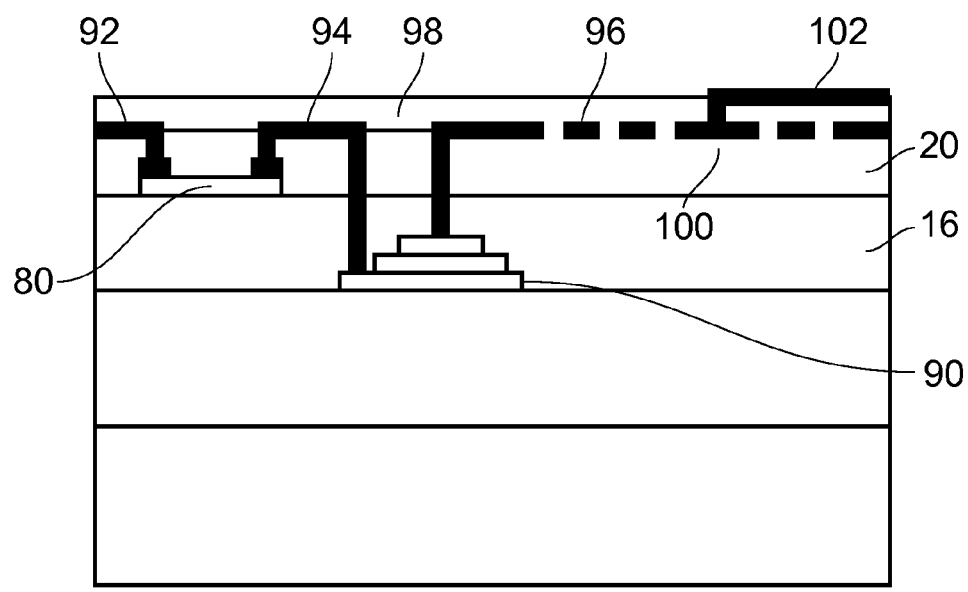
FIG. 13 shows the wafer of FIG. 12 in which the metal has been patterned so as to form a spiral conductor.
Figure 14:
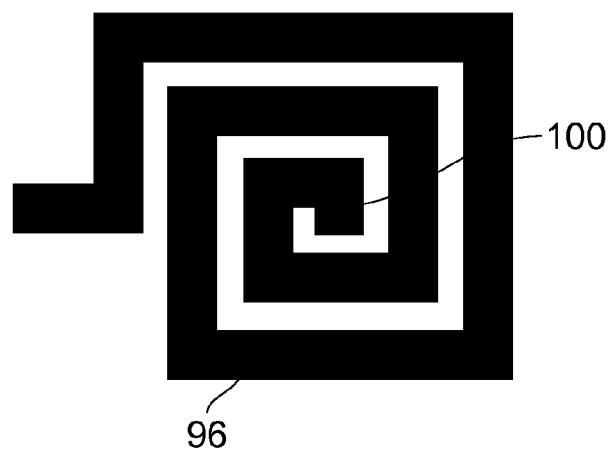
FIG. 14 is a plan view of the spiral conductor of FIG. 13.
Figure 15:
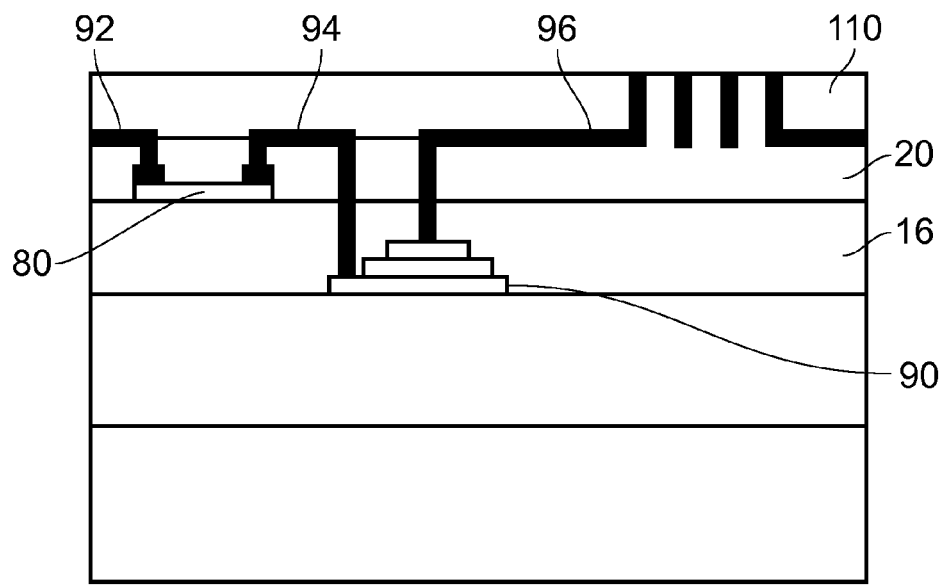
FIG. 15 shows the wafer of FIG. 12 in which the metal has been patterned, a further insulating layer deposited and etched, and further metal deposited so as to form a solenoid like inductor.
Figure 16:
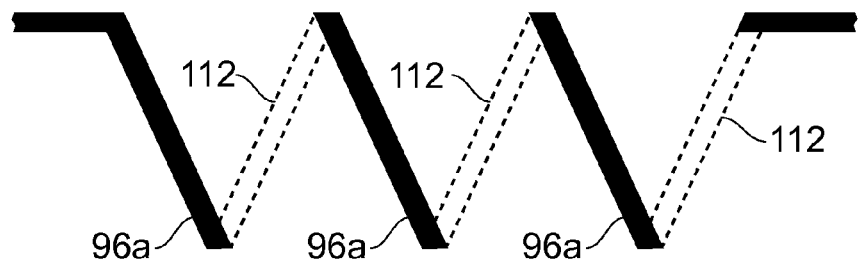
FIG. 16 is a plan view showing the relative orientations of metallic conductors forming the inductor.

A portion of the metal layer 96 may be patterned to from a planar spiral, which in this example would spiral inwards to a central connecting region 100 (FIG. 13). A further oxide layer 98 may be formed over the spiral inductor and then a further connection 102 may be made through the oxide 98 as shown in FIG. 13. The spiral inductor and its central connection region 100 are shown in plan view in FIG. 14. Alternatively, and as shown in FIG. 15, the portion 96 may be etched to form a series of parallel stripes 96a. The stripes may then be encapsulated in an oxide layer 110 which is then selectively masked and etched to expose the end of each stripe. Then a striped metallic layer comprising conductors 112 is deposited over the insulating oxide layer so as to connect a first end of one stripe 96a to an opposing second end of an adjacent stripe 96a, thereby forming an inductor, as shown in plan view in FIG. 16, where the conductors 112 are shown in chain line outline to indicate that they are above the plane of the conductor 96.

This fabrication technique is not limited to forming resistors, inductors and capacitors (either of fixed capacitance as formed by spaced apart metal plates or as a varactor). The technique can also be used with other components, such as electrically controlled switches, but equally other MEMS components can be formed. While not "passive," such devices can be formed by thin film techniques and need not include single crystal semiconductor layers.

Figure 17:
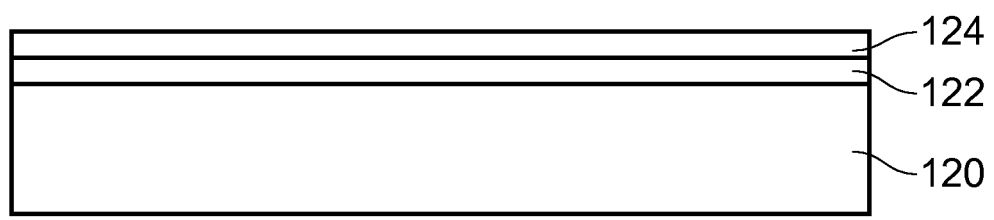
FIG. 17 is a cross-section of a silicon wafer after deposition of an etch stop layer and an insulating layer used in the formation of a mechanical switch.

As shown in FIG. 17, the fabrication of a MEMS switch commences with a handle wafer, such as silicon wafer 120 over which an etch stop layer 122 is deposited, and then an oxide layer 124 is formed over the etch stop layer 122. As discussed herein above, the etch stop layer 122 may be silicon nitride, silicon dioxide or other suitable material that can "stop" a silicon etch. The layer 124 may be silicon dioxide, which can be formed using CVD techniques. However, the layers 122 and 124 may be combined as a single layer, where for example the combined layer may be thermal oxide as this has a relatively slow etch rate when exposed to silicon etchants.

Figure 18:
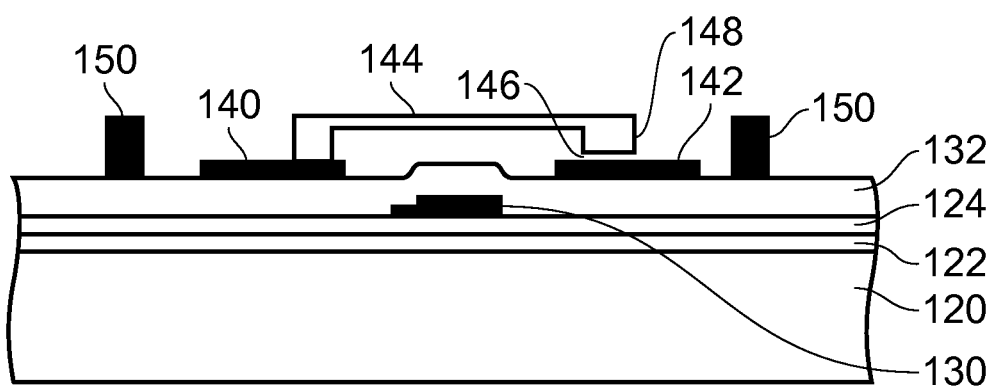
FIG. 18 shows the wafer of FIG. 17 after a MEMS component, in this example a mechanical switch, has been formed thereon using known techniques.

The wafer may then be subjected to the processing steps known to the person skilled in the art of MEMS processing for the formation of a micro-machined switch. Thus, and as shown in FIG. 18, a control gate 130 is formed over the oxide layer 124, and then buried under a further insulating layer 132, for example of silicon dioxide. Then first and second gold (but other metals may be used) contacts 140 and 142 are formed on either side of the control gate 130, and a cantilevered portion 144 is also formed such that it extends from the first contact 140 towards the second contact 142 so as to stand over the second contact 142 leaving a small gap 146 between a free end portion 148 of the cantilever 144 and the second contact 142.

Spacers or up-stands 150 are formed around the switch formed by the cantilever 144 and the contacts 140, 142. Generally the fabrication steps result in the spacers 150 being level with an upper surface of the cantilever 144.

Figure 19:
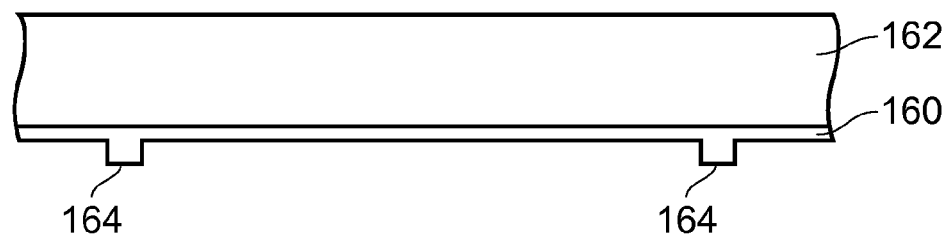
FIG. 19 is a section through a glass cover for the switch of FIG. 18.
Figure 20:
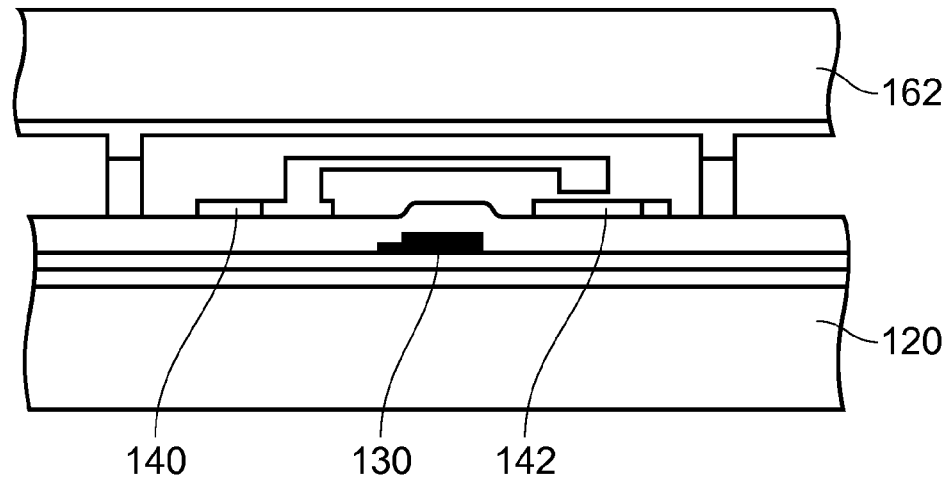
FIG. 20 shows the switch of FIG. 18 with the cover of FIG. 19 bonded thereto.

As shown in FIG. 19, a cooperating glass cover 162 is prepared with a metal layer 160, for example gold, formed on one surface of the glass cover 162. The gold layer 160 is profiled with supports 164 that extend from the layer 160 in such a way that they can register with the supports 150. The two parts, namely the cover and the base, can be bonded together (for example by use of temperature or an adhesive or a solder, or a glass frit) to form a unitary structure, as shown in FIG. 20, in which the switch is held inside a chamber, which itself may be at a low pressure, be evacuated, or be filled with a chosen atmosphere (for example dry nitrogen or an inert gas). The metal layer 160 serves to protect the switch from external electrostatic fields that might perturb its correct operation.

Figure 21:
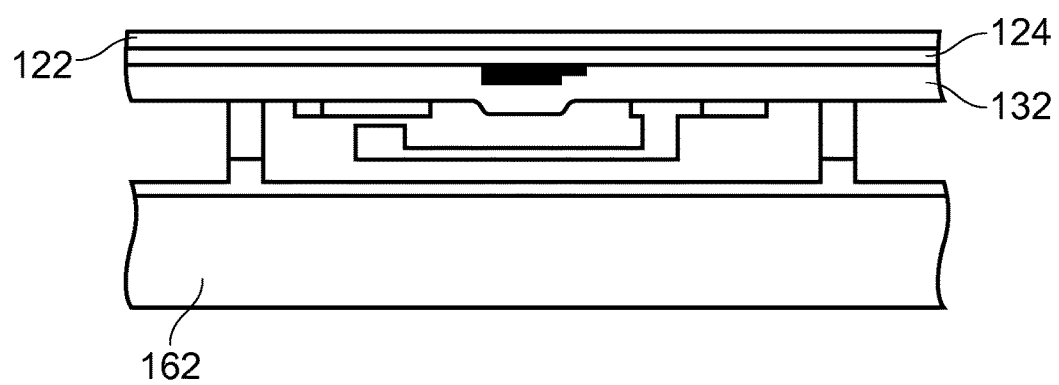
FIG. 21 shows the switch of FIG. 20 after the silicon wafer has been removed, leaving the glass cover as the substrate that acts as a handle wafer.

Then the structure is inverted so as to hold it by the glass cover 162 and to reveal the silicon substrate. The silicon substrate 120 is removed (wholly or partially) by machining and/or etching to provide a MEMS switch sandwiched between the glass substrate 162 and the silicon dioxide layers 132 and 124, as shown in FIG. 21. Although the structure of the switch has been formed, there are no contacts to it as yet.

Figure 22:
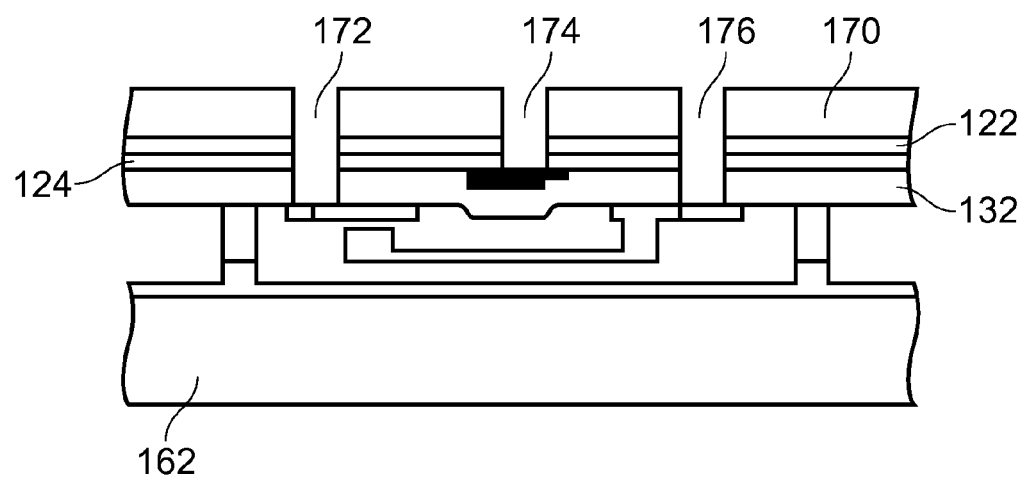
FIG. 22 shows the switch of FIG. 21 after "back side" etching to reveal bond pads for the switch contacts and with an optional protective layer formed over the etch stop layer.

This is addressed by a masking and etching step so as to selectively remove portions of the silicon dioxide so as to expose the bond pads for the contacts 140 and 142, and to make a control connection to the gate 130. This may optionally be performed in conjunction with forming a further protective layer, 170, such as a polyimide layer, over the switch. A structure such as that shown in FIG. 22 may result where a plurality of vias 172, 174 and 176, which may be filled with metal, extend through the layers 170, 122, 124 and 132. Connections may be made to the vias in a known way.

The operation of the switch is well known, but for completeness, when the potential of the gate 130 differs from that of the first contact 140, an electrostatic force urges the cantilever to bend towards the gate 130, and in so doing is arranged to cause the end portion 148 (FIG. 18) to touch the second contact 142, thereby forming a circuit between contacts 140 and 142.

Figure 23:
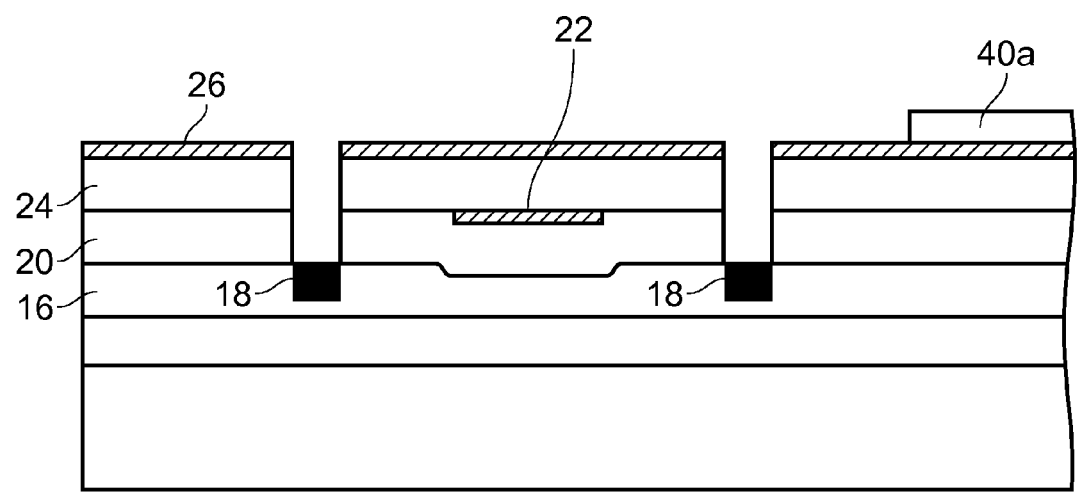
FIG. 23 shows a modification of the arrangement shown in FIG. 1 but which is applicable to any of the examples shown herein where an offset silicon layer is provided over the insulating substrate such that active components can be provided.

FIG. 23 shows a modification to the embodiment of FIG. 1. It will be recalled that during the manufacture, the original silicon substrate 40 (FIGS. 2-5) is removed in its entirety. However, this need not always be the case, and the removal of the substrate 40 may be stopped at an appropriate point, and a mask applied to portions of it to protect it before a further etching step is commenced. As a consequence a portion 40a of the substrate may be allowed to remain, as shown in FIG. 23. This enables active devices, such as transistors, to be formed in close proximity to the circuit formed by the passive components.

Furthermore it follows that the transistors and other active circuit components may be formed in the silicon substrate 40 prior to deposition of the etch stop layer 26, and furthermore apertures may be provided in the etch stop layer 26 to reveal connections to the circuit formed in the region 40a of the substrate 40. Additionally or alternatively, once the region 40a has been exposed (as shown in FIG. 23) its surface may be planarized and then masking and doping steps may be executed to form transistors in the upwardly facing surface of the portion 40a. The metals that have already been deposited should be able to withstand the temperatures used in the transistor processing. Although these additional processing steps incur additional cost, they are routinely available in semiconductor fabrication facilities and are still much less expensive than silicon on sapphire techniques.

Hitherto the semiconductor substrate has, for simplicity, been shown as being unitary or monolithic. However this need not be the case. The techniques disclosed herein are suitable for use with multiple dies that may be bonded to a shared insulating substrate. The techniques disclosed are also suitable for use with bonded wafers (known to the person skilled in the art for their use in silicon on insulator, SOI, processes to achieve good isolation between selected devices) where two layers of silicon are bonded together with an intermediate oxide layer. The bonded wafer may be etched back in its entirety, or merely partially so as to reach the oxide layer. However, the techniques presented herein where a component, whether passive or active, can be transferred to a further substrate makes the process described herein a rival to use of bonded wafers.

It is thus possible to provide a microelectronic or integrated circuit where high frequency passive networks can be formed inexpensively over a highly insulating substrate. This avoids the formation of parasitic capacitances between the passive component and the underlying semiconductor substrate, which would act as a conductor among the various parasitic capacitances, thereby degrading operation of the circuit. It is also possible to achieve this using processing steps that are routinely available. Furthermore it is possible to provide an integrated circuit that has a low loss substrate and active semiconductor regions thereon.

The claims have been drafted in single dependency format as is normal for submission at the United States Patent and Trademark Office. However, for other jurisdictions where multiple dependent claims are allowable without punitive cost, it is noted that each claim may be dependent on any preceding claim of the same type except where that is clearly not technically feasible.

What is claimed is:

1. A microelectronic circuit comprising:
   a carrier which is not a semiconductor or sapphire;
   a microelectromechanical systems (MEMS) switch comprising a first contact, a second contact, and a cantilever extending from the first contact, the MEMS switch integrated with and adjacent to the carrier;
   an etch stop layer comprising material that is slower etching than silicon, wherein the etch stop layer has a first side and second side opposite the first side, wherein the MEMS switch is disposed between the first side of the etch stop layer and the carrier, wherein there is no semiconductor layer on the second side of the etch stop layer, and wherein the MEMS switch and the etch stop layer are integrated with each other; and
   a plurality of insulating layers arranged in a stack, the stack having a first side and a second side opposite the first side, the first side being bounded by the etch stop layer and at least a portion of the second side being between the MEMS switch and the etch stop layer,
   wherein there is a gap between the cantilever and the second contact in a first state, and wherein the cantilever is in contact with the second contact in a second state to thereby provide an electrical connection between the first contact and the second contact in the second state.

2. A microelectronic circuit as claimed in claim 1, in which the carrier functions as a substrate or as a die for the microelectronic circuit.

3. A microelectronic circuit as claimed in claim 1, further comprising one or more components from a group comprising resistors, inductors, transformers, and capacitors, wherein the one or more components are disposed between the MEMS switch and the etch stop layer.

4. A microelectronic circuit as claimed in claim 1, in which the carrier is formed of glass or quartz.

5. A microelectronic circuit as claimed in claim 1, further comprising a bond layer attached to the carrier, in which the bond layer is a glass frit, a metal-metal bond layer or a region treated so as to form an anodic bond.

6. A microelectronic circuit as claimed in claim 1, in which at least one of the plurality of insulating layers is formed of a semiconductor oxide.

7. A microelectronic circuit as claimed in claim 1, further comprising a metal-metal bond layer attached to the carrier and a plurality of supports, wherein the metal-metal bond layer comprises gold.

8. A microelectronic circuit as claimed in claim 1, wherein the etch stop layer comprises at least one of an oxide or a nitride.

9. A microelectronic circuit as claimed in claim 1, further comprising a metal layer configured to protect the MEMS switch from external electrostatic fields.

10. A microelectronic circuit as claimed in claim 1, wherein at least one of the plurality of insulating layers is formed of a semiconductor nitride.

11. A microelectronic circuit comprising:
a glass substrate;
a microelectromechanical systems (MEMS) switch comprising a first contact, a second contact, and a cantilever extending from the first contact and electrical contacts therein;
an etch stop layer comprising a material having a slower etch rate than silicon, wherein the etch stop layer has a first side and second side opposite the first side, wherein the MEMS switch and the etch stop layer are integrated with each other, and wherein the MEMS switch is disposed between the glass substrate and the first side of the etch stop layer;
a plurality of insulating layers arranged in a stack, the stack having a first side and a second side opposite the first side, the first side being bounded by the etch stop layer and at least a portion of the second side being between the MEMS switch and the etch stop layer; and
a bond layer attached to the glass substrate and disposed between the glass substrate and the etch stop layer,
wherein there is a gap between the cantilever and the second contact in a first state, and wherein the cantilever is in contact with both the first contact and the second contact in a second state.

12. A microelectronic circuit as claimed in claim 11, wherein the bond layer is formed of glass frit.

13. A microelectronic circuit as claimed in claim 11, the bond layer is a metal-metal bond layer comprising a plurality of supports.

14. A microelectronic circuit as claimed in claim 11, wherein there is no semiconductor layer on the second side of the etch stop layer that is opposite the bond layer.

15. A microelectronic circuit as claimed in claim 11, wherein the bond layer is attached to a planar surface of the glass substrate that is farthest from an opposite side of the glass substrate.

16. An integrated circuit comprising:
a non-semiconductor substrate having a first side and a second side, the second side opposing the first side;
a microelectromechanical systems (MEMS) switch comprising a first contact, a second contact, and a cantilever extending from the first contact, wherein the MEMS switch is integrated with and adjacent to the non-semiconductor substrate, and wherein there is a gap between the cantilever and the second contact in a first state, and wherein the cantilever is in contact with both the first contact and the second contact in a second state;
supports around the MEMS switch, the supports being disposed on a plurality of layers, and the plurality of layers including a plurality of insulating layers arranged in a stack, wherein the stack is positioned between the MEMS switch and an etch stop layer; and
a bond layer attached to the first side of the non-semiconductor substrate, and the bond layer also being attached to the supports.

17. A circuit as claimed in claim 16, in which the bond layer is formed of glass frit.

18. A circuit as claimed in claim 16, in which at least one of the plurality of insulating layers is formed of a semiconductor oxide.

19. A circuit as claimed in claim 16, wherein the plurality of layers further comprises third to Nth further layers formed of a semiconductor oxide, a semiconductor nitride or polyamide and having metallic tracks forming interconnects, or resistors, or inductors or plates of capacitors formed therein or thereon.

20. An integrated circuit as claimed in claim 16, wherein the etch stop layer comprises a material having a slower etch rate than silicon, wherein the MEMS switch is disposed between the etch stop layer and the bond layer.

21. An integrated circuit as claimed in claim 16, wherein the bond layer is a metal-metal bond layer comprising a plurality of supports.

22. A circuit as claimed in claim 16, wherein at least one of the plurality of insulating layers is formed of a semiconductor nitride.

23. A circuit as claimed in claim 16, wherein the non-semiconductor substrate comprises a glass substrate.

24. A circuit as claimed in claim 16, further comprising a spacer between the non-semiconductor substrate and the plurality of insulating layers.

25. A circuit as claimed in claim 16, further comprising a metal layer configured to protect the MEMS switch from external electrostatic fields.

26. An integrated circuit as claimed in claim 20, wherein there is no semiconductor layer on a side of the etch stop layer that is opposite to the MEMS switch.

* * * * *